United States Patent
Buxton et al.

(10) Patent No.: US 11,049,581 B2
(45) Date of Patent: *Jun. 29, 2021

(54) MEDIA ERROR REPORTING IMPROVEMENTS FOR STORAGE DRIVES

(71) Applicant: Toshiba Memory Corporation, Tokyo (JP)

(72) Inventors: Neil Buxton, Berkshire (GB); Shigehiro Asano, Tokyo (JP); Steven Wells, Rancho Cordova, CA (US); Mark Carlson, Longmont, CO (US)

(73) Assignee: Toshiba Memory Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/811,694

(22) Filed: Mar. 6, 2020

(65) Prior Publication Data

US 2020/0303029 A1 Sep. 24, 2020

Related U.S. Application Data

(63) Continuation of application No. 16/145,856, filed on Sep. 28, 2018, now Pat. No. 10,607,712.

(51) Int. Cl.
| | |
|---|---|
| *G06F 11/08* | (2006.01) |
| *G06F 13/00* | (2006.01) |
| *G11C 11/34* | (2006.01) |
| *G11C 16/04* | (2006.01) |
| *G11C 29/00* | (2006.01) |
| *G11C 29/04* | (2006.01) |
| *G06F 11/07* | (2006.01) |

(Continued)

(52) U.S. Cl.
CPC ............ *G11C 29/04* (2013.01); *G06F 3/0619* (2013.01); *G06F 3/0653* (2013.01); *G06F 3/0688* (2013.01); *G06F 11/0766* (2013.01); *G06F 11/106* (2013.01); *G06F 11/3055* (2013.01); *G11C 29/835* (2013.01)

(58) Field of Classification Search
CPC ..... G11C 29/04; G11C 29/835; G06F 3/0619; G06F 3/0653; G06F 3/0688; G06F 11/0766; G06F 11/106; G06F 11/3055
USPC ............................................ 365/200, 185.09
See application file for complete search history.

(56) References Cited

U.S. PATENT DOCUMENTS

| | | | | |
|---|---|---|---|---|
| 5,701,450 A | * | 12/1997 | Duncan | G06F 3/0601 710/36 |
| 8,438,453 B2 | * | 5/2013 | Post | G06F 11/1068 714/763 |

(Continued)

*Primary Examiner* — Ly D Pham
(74) *Attorney, Agent, or Firm* — White & Case LLP

(57) ABSTRACT

A method of managing errors in a plurality of storage drives includes receiving, at a memory controller coupled to at least one storage medium in an SSD, a read command from a host interface. The method also includes retrieving, from the storage medium, read data corresponding to a plurality of data chunks to be retrieved in response to the read command, and determining that at least one data chunk of the plurality of data chunks is unable to be read, the at least one data chunk corresponding to a failed data chunk. And in response to determining the failed data chunk, sending to the host interface the read data including the failed data chunk or excluding the failed data chunk. And in response to the read command sending to the host interface status information about all data chunks.

20 Claims, 5 Drawing Sheets

(51) Int. Cl.
 *G06F 11/30* (2006.01)
 *G06F 11/10* (2006.01)
 *G06F 3/06* (2006.01)

(56) References Cited

U.S. PATENT DOCUMENTS

| | | | |
|---|---|---|---|
| 2006/0193074 A1* | 8/2006 | Williams | G06F 3/0613 360/75 |
| 2006/0193470 A1* | 8/2006 | Williams | H04L 9/0894 380/259 |
| 2006/0195842 A1* | 8/2006 | Williams | G06F 3/0659 718/100 |
| 2007/0005829 A1* | 1/2007 | Fujimoto | G06F 13/385 710/48 |
| 2008/0086590 A1* | 4/2008 | Urabe | G06F 13/1668 711/103 |
| 2010/0318718 A1* | 12/2010 | Eilert | G06F 3/0688 711/103 |
| 2011/0041005 A1* | 2/2011 | Selinger | G06F 11/10 714/719 |
| 2011/0041039 A1* | 2/2011 | Harari | G11C 29/76 714/773 |
| 2011/0161784 A1* | 6/2011 | Selinger | G06F 11/1068 714/768 |
| 2012/0221924 A1 | 8/2012 | Flynn et al. | |
| 2014/0040702 A1 | 2/2014 | He et al. | |
| 2014/0189212 A1 | 7/2014 | Slaight et al. | |
| 2015/0193155 A1 | 7/2015 | Sarcone et al. | |
| 2017/0018315 A1 | 1/2017 | Chae | |
| 2017/0091029 A1 | 3/2017 | Cho | |
| 2017/0168894 A1 | 6/2017 | Kim et al. | |
| 2017/0199783 A1 | 7/2017 | Lee | |
| 2017/0212939 A1 | 7/2017 | Mukherjee et al. | |
| 2017/0322847 A1 | 11/2017 | Park | |
| 2018/0089024 A1* | 3/2018 | Hahn | G06F 11/1048 |
| 2018/0262567 A1* | 9/2018 | Klein | G06F 3/0631 |
| 2018/0284989 A1 | 10/2018 | Kachare et al. | |
| 2019/0028123 A1 | 1/2019 | Cho | |

* cited by examiner

MEDIA ERROR REPORTING IMPROVEMENTS FOR STORAGE DRIVES

CROSS-REFERENCE TO RELATED APPLICATION

This application is a continuation of application Ser. No. 16/145,856 filed Sep. 28, 2018, the entire contents of which are incorporated herein by reference.

FIELD OF THE INVENTION

The present invention generally relates to systems and methods for managing errors in solid state drives (SSDs).

BACKGROUND OF THE INVENTION

Storage drives (e.g., SSDs which stores data in units of pages and blocks, and HDDs which stores data in units of sectors and tracks) are normally comprised of one or more memory controllers and non-volatile memory. A host sends read commands to the storage drive requesting the return of a number of data blocks which are stored on the storage drive. In response to the read command, the memory controller associated with the storage drive attempts to retrieve the requested data blocks from the storage drive. Conventionally, in response to a successful read, the memory controller returns the requested data and a status indicative of a successful read. In response to a failed read, which results from a failure to read any of the requested blocks, the memory controller returns no read data, and only returns a status indicative of a failed read. If the failed read happened after a request to return a large number of data blocks, the host is given no indication which of the requested data block(s) were in error.

In this case, in response to receiving a failed status indicator, the host must take further steps to determine the location of the failed data. In conventional methods, the host either requests all the read data from other redundant drives and mechanisms such as RAID or attempts to identify the failing blocks by issuing additional multiple read commands with smaller read ranges. Alternatively, the host uses additional commands designed for drive health management to retrieve locations of failing data. Conventional methods require additional commands, extra storage space, processing time, and power resources to retrieve the failed data locations and complete the read command.

As data becomes more complex, read commands are increasingly issued for larger and larger packets of data, consisting of blocks, which in turn yield a higher likelihood of failure of the read command. Accordingly, there is an unmet demand for storage drives to be capable of handling failed read commands more efficiently.

BRIEF DESCRIPTION OF THE INVENTION

In an aspect, a method of managing errors in a plurality of solid state drives (SSDs) includes receiving, at a memory controller coupled to at least one storage medium in a plurality of storage media, a read command from a host via a host interface. The method also includes retrieving, from the storage medium, read data corresponding to a plurality of data chunks to be retrieved in response to the read command, and determining, that at least one data chunk of the plurality of data chunks is unable to be read due to errors, the at least one data chunk corresponding to a failed data chunk. And in response to determining the failed data chunk, sending to the host interface the read data including the failed data chunk or excluding the failed data chunk.

In another aspect, a system for managing errors in a plurality of storage media includes a host interface, a memory controller configured to be communicatively coupled to a host via the host interface, and at least one storage medium communicatively coupled to the memory controller. The memory controller is configured to receive a read command from the host interface, retrieve, from the at least one storage medium, read data corresponding to a plurality of data chunks to be retrieved in response to the read command, determine that at least one data chunk of the plurality of data chunks is unable to be read due to errors, the at least one data chunk corresponding to a failed data chunk. In response to determining the failed data chunk, send to the host interface the read data including the failed data chunk or excluding the failed data chunk.

BRIEF DESCRIPTION OF THE FIGURES

According to one or more embodiments.

According to one or more embodiments.

According to one or more embodiments.

According to one or more embodiments.

DETAILED DESCRIPTION OF THE INVENTION

Figure 1:
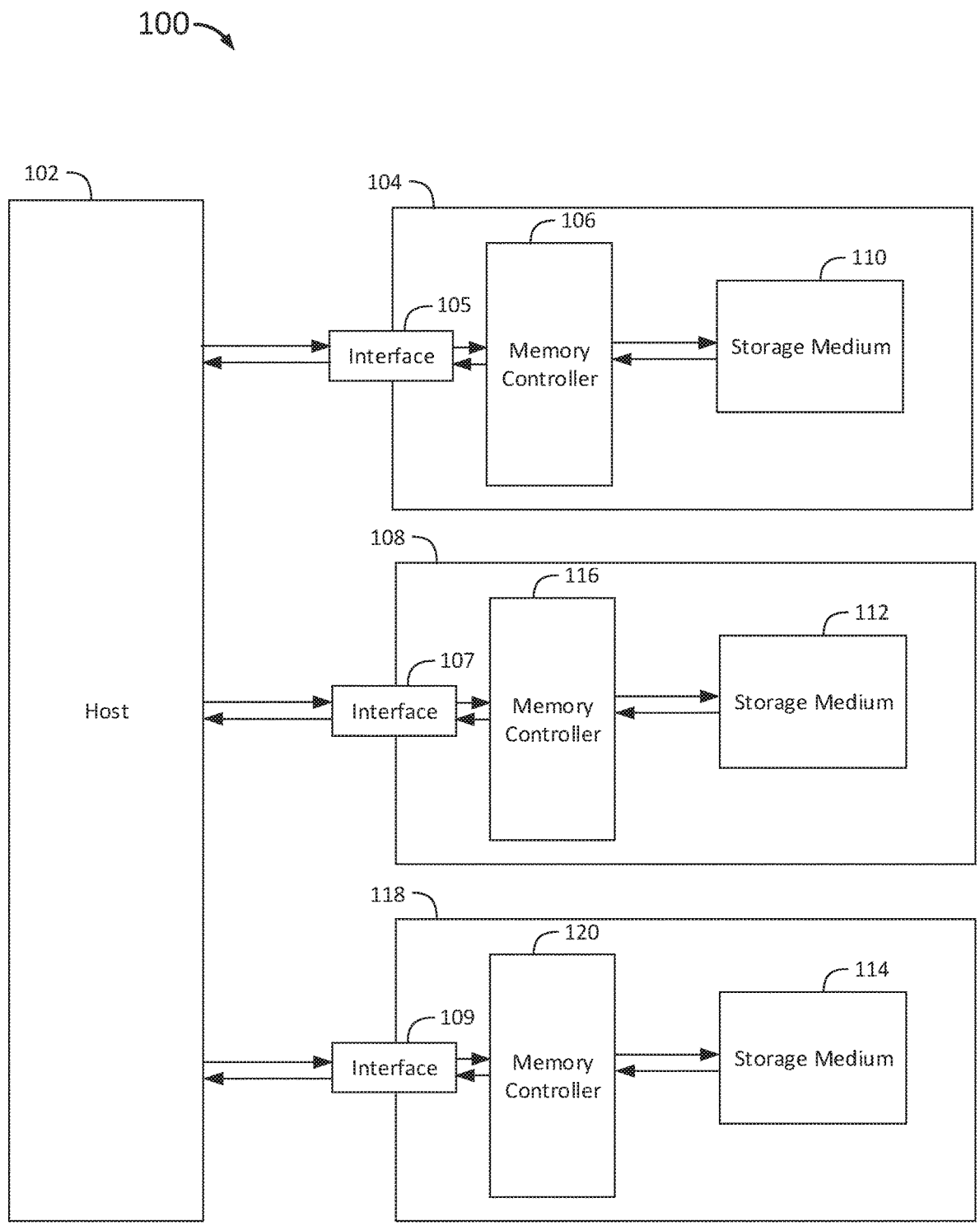
FIG. 1 shows a block diagram of a storage system for managing errors in a plurality of storage media.

As referred to herein, a "data chunk" can correspond, for example, to a logical block of data formed by one or more sectors of data in an SSD or an HDD. Also as referred to herein, a storage medium is non-volatile memory that can be, among other devices, a storage device such as an SSD or an HDD, and storage media, also termed a storage array, could be non-volatile memory that can comprise one or more SSDs, one or more HDDs, or a combination of one or more SSDs and HDDs or other storage devices.

In an embodiment, a storage device comprises a memory controller that is communicatively coupled to storage media. The storage device may communicate with a host interface via the memory controller. The host issues various commands, such as write, read, or deallocate commands, via the host interface, to a memory controller which handles the commands accordingly. A host issues read commands to the memory controller, via the host interface, requesting data stored on the storage media. The requested data may be stored across multiple storage mediums in the storage media or may be stored in its entirety on one storage medium in the plurality of storage mediums.

In one embodiment, read commands constitute a single address range or multiple address range describing data locations in the storage media which are to be read (i.e., returned to the host). In some cases, the address range or ranges in a read command may refer to large portions of the memory, which may be several GB in size.

In response to issuing a read command, the host receives a response from the memory controller, via the host interface, indicating whether the read was successful (i.e., a pass/fail). In some instances, the memory controller returning all of the requested data indicates a successful read. In some instances, the memory controller returning the requested data and sending a status bit (or bits) to the host (via the host interface), where the status indicates success (e.g., the status bit is set to 1, when 1 indicates a success and 0 indicates a failure), indicates a successful read. In some instances, a failed read is indicated by the status bit/bits indicating a failure (e.g., the status bit is set to 0). The memory controller sends to the host the read data including or excluding the failed data chunk, as well as information with the location of at least one data chunk that failed during the execution of the read command. Data chunks may be unable to be read when they contain errors and/or are corrupted. The location information may be sent in the status information in the form of a bitmap or the result of Run-Length encoding.

Improved methods of media error reporting for storage media improves the efficiency and speed of convergence for read error recovery are described herein. In one or more embodiments, the improved methods might not require the storage space reserved in conventional systems for error correction techniques used to fixed failed data chunks and provide results with less delay and using less power. This previously reserved storage space can be advantageously used to store more data in combination with other redundant storage drives. Reduced read latencies allow the operation of the storage media at higher data throughput rates and reduced power consumption can provides benefits in reduced cooling requirements and electricity costs.

FIG. 1 shows one embodiment of a block diagram of a storage system 100 for managing errors in a plurality of storage media. Storage system 100 includes a host 102, storage devices 104, 108, and 118, respectively, host interfaces 105, 107, and 109, respectively, memory controllers 106, 116, and 120, respectively, and storage mediums 110, 112, and 114, respectively. Storage devices 104, 108 and 118, may be any combination of local or remote storage. For example, storage device 104 and storage device 108 may be local storage (e.g., housed in the same data center), while storage device 118 may be remote storage (e.g., housed in a data center at a different physical location). Memory controller 106 is communicatively coupled to storage medium 110, and can both send and receive communications from storage medium 110. Host 102 is communicatively coupled to memory controllers 106, 116, and 120 and can both send to and receive communications from memory controllers 106, 116, and 120 via respective host interfaces 105, 107, and 109.

In storage system 100, memory controller 106 receives a read command from host 102 via host interface 105 requesting one or more chunks of data from storage medium 110. The read command comprises the single logical address range or multiple logical address ranges describing the requested data chunk locations in storage medium 110. Memory controller 106 retrieves the requested data chunks from the locations in storage medium 110 corresponding to the single address range or multiple address ranges. Memory controller 106 transmits the requested data chunks and status information to host 102 via host interface 105.

In some instances, the requested data chunks may contain errors that corrupt specific data, preventing the correct data from being retrieved by memory controller 106 or transmitted to host 102 via host interface 105.

In some embodiments, memory controller 106 may return the requested read data with 'holes' where the one or more data chunks were unable to be read due to errors. Memory controller 106 'returns' the requested data by writing the data into a buffer (not shown), as specified by host 102. As the memory controller 106 is writing the data into the buffer, the memory controller may write only the readable data into the buffer, and not write data into the one or more locations in the buffer meant for the failed data chunks (e.g., creating 'holes' in the requested data). Therefore, these one or more locations in the buffer meant for the failed data chunks may contain the previous data that was present in the buffer before it was allocated by host 102 to store the requested read data.

In some embodiments, memory controller 106 may return the requested read data by writing the readable data chunks in the locations specified by host 102, and by writing placeholder data (i.e., dummy data) in the locations in the buffer meant for the data from the failed data chunks. The placeholder data, for example, may contain all zeros, all ones, all 'F's in hexadecimal, or any other data in a fixed pattern or a random pattern.

In some embodiments, memory controller 106 may return the requested read data by writing the readable data chunks in the locations specified by host 102, and raw errored data (i.e. raw uncorrected data as read from the storage medium) in the locations in the buffer meant for the data from the failed data chunks. For example, memory controller 106 may write the data with errors (or corrupted data) from the failed data chunks in the one or more locations in the buffer mean for the data from the failed data chunks.

Figure 3:
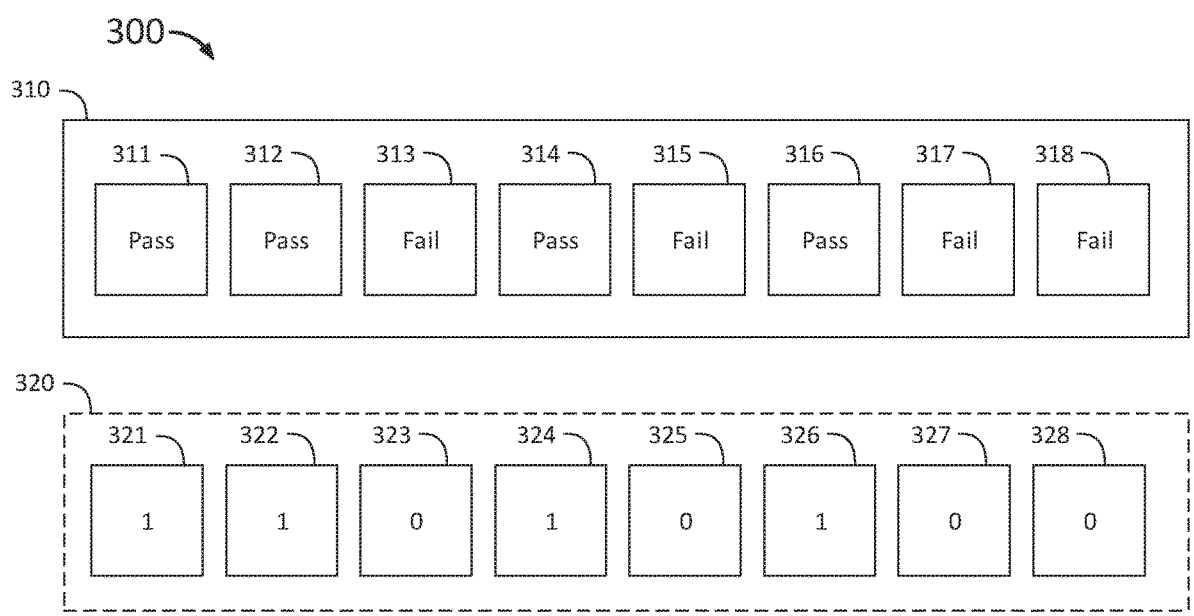
FIG. 3 shows a block diagram of a data failure location determination using a bit map.
Figure 4:
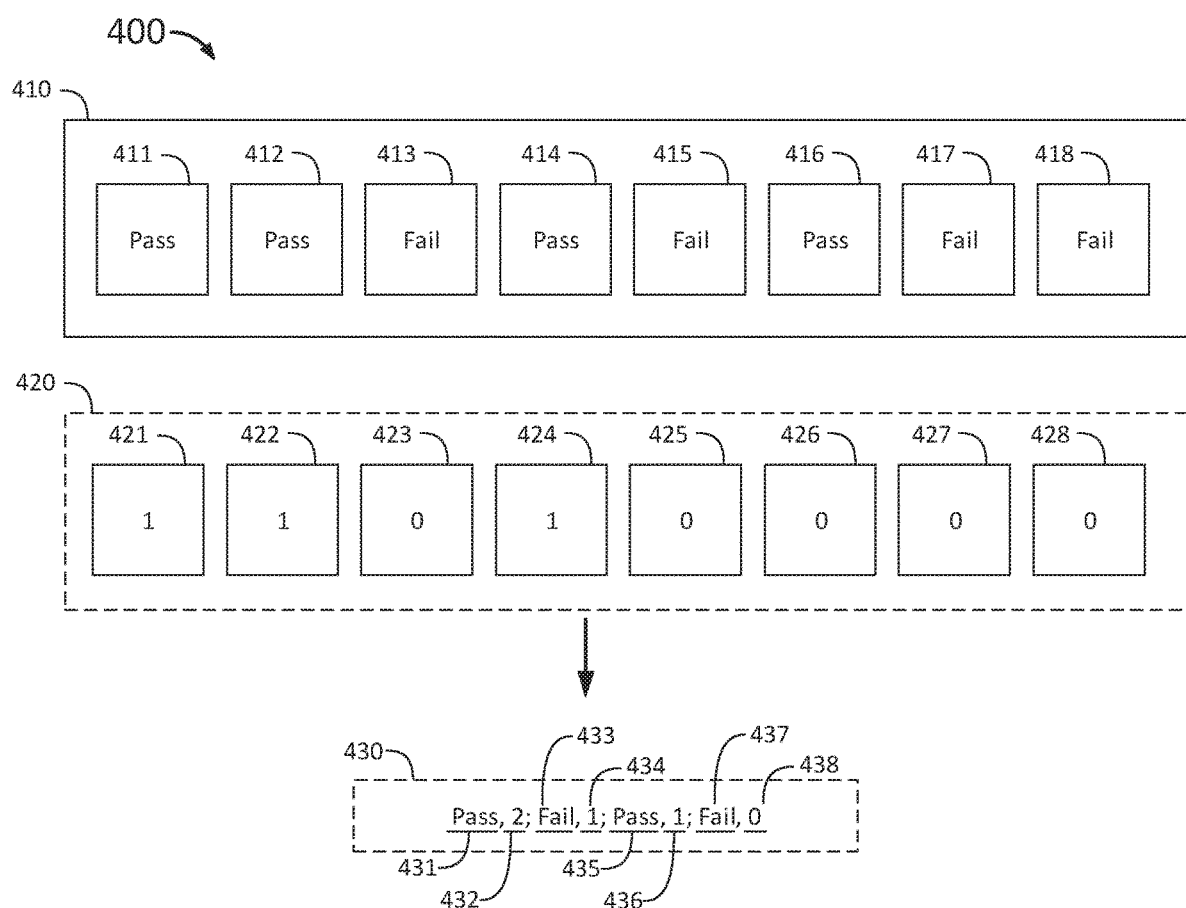
FIG. 4 shows a block diagram of a data failure location determination using Run-Length encoding; and According to one or more embodiments.

The memory controller 106 may determine the location of the requested data chunks that contain errors during the read process creating an error map, such as a bitmap where 1s or 0s may be used to indicate chunks with and without errors. In some embodiments, this error map may be provided as a field in a status which is used to indicate the result of the read command. For example, the status may be provided within a completion queue entry in response to an NVMe read command, which the host may access. In some embodiments, if the size of the bitmap exceeds the width of the field, a bit in the status may indicate that the bitmap may be provided in response to a separate command, for example a Get Log Page command. In some embodiments, the error map may be provided in response to a vendor specific command which requests the memory controller to return an error map for a read command previously issued. To conserve space, the bitmap may be compressed using a compression scheme, such as Run-length encoding. An error map such as a bitmap or a Run-Length encoded compressed bitmap are two exemplary error location methods described in this specification, but any similar method may be employed to determine the location of the failed data chunks. FIGS. 3 and 4 describe particular embodiments for determining the location of the one or more failed data chunks in detail.

Memory controller 106 may update an error map concurrently when retrieving the requested data chunks. In some embodiments, when memory controller 106 cannot retrieve at least one failed data chunk in the plurality of requested data chunks, memory controller 106 transmits the successfully retrieved data chunks, if any, and the location of the at least one failed data chunk, identified by the error map, to host 102 via host interface 105.

In some instances, the host 102 may use the raw, errored data returned by the memory controller 106 for the failed data chunks and use its own ECC parity bits added to the data chunks being stored to perform ECC decoding of the errored data into error free data.

In some instances, host 102 may recover the one or more failed data chunks from redundant storage drives. For example, some storage systems may have multiple storage drives for data redundancy; storage device 104 may have storage mediums 108 and 118 as redundant storage medium. In some instances, storage systems may have both local and remote storage drives for data redundancy. When host 102 retrieves the one or more failed data chunks from redundant storage drives, host 102 may first attempt to retrieve the failed data chunks from local storage media. For example, host 102 may instruct memory controller 116 coupled to redundant local storage medium 112 to retrieve the one or more failed data chunks. If memory controller 116 cannot retrieve the failed data chunks from redundant local storage media 112 (e.g., the requested chunks of data are corrupt in the redundant local storage as well), then host 102 may then attempt to retrieve the failed data chunks from redundant remote storage 114. The ordering of attempting to retrieve the redundant data from local storage first and then remote storage second is motivated by costs and efficiency. It is more efficient (e.g., uses less processing and power) to retrieve redundant data from local storage than remote storage.

In some instances, host 102 may attempt to retrieve the one or more failed data chunks using multiple redundant storage devices.

Figure 2:
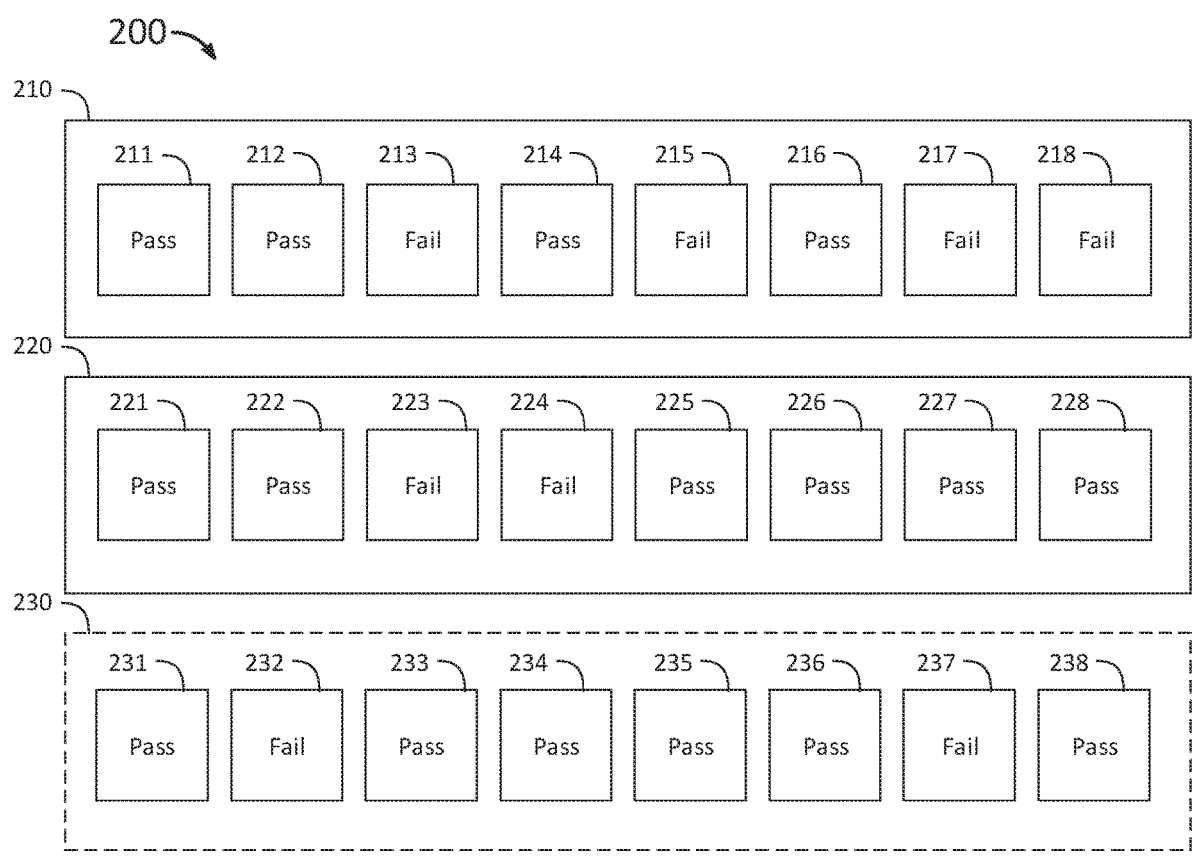
FIG. 2 shows a block diagram of three storage mediums with errors.

FIG. 2 shows block diagram 200 of three storage mediums of non-volatile memory with errors. Block diagram 200 includes storage medium 210, which includes data chunks 211-218, storage medium 220, which includes data chunks 221-228, and storage medium 230, which includes data chunks 231-238. Data chunks 211, 212, 214, 216, 221, 222, 225-228, 231, 233-236, and 238 correspond to successful reads (i.e., these data chunks do not contain errors), and data chunks 213, 215, 217, 218, 223, 224, 232, and 237 correspond to data that is unable to be read due to errors (i.e., these data chunks contain errors and may be corrupt). Data chunks 211-218, 221-228, and 231-238 may comprise only a portion of the total data chunks in storage mediums 210, 220, and 230, respectively. Storage mediums 210, 220, and 230 may correspond to storage mediums 110, 112, and 114, respectively.

For example, data chunks 211-218, 221-228, and 231-238 may each store 4 KB of data. If host 102 issues a 32 KB read command for the data stored in storage medium 210, the memory controller would not be able to retrieve data chunks 213, 215, and 217-218. Host 102 may attempt to retrieve the failed data chunks (the locations determined from the error map, for example, as described in relation to FIGS. 3-4) from redundant data storage.

For example, storage mediums 220 and 230 may be a local redundant storage medium and remote redundant storage medium, respectively, for storage medium 210. Data chunks 221-228 and 231-238 correspond to two sets of redundant data chunks for data chunks 211-218. Host 102 may instruct a memory controller (e.g., memory controller 106), via a host interface (e.g., host interface 105) to first attempt to retrieve failed data chunks from local redundant storage medium 220. Memory controller 106 would be able to retrieve data chunks corresponding to data chunk 215, 217, and 218. However, memory controller 106's attempt to retrieve data chunk 223, the redundant data chunk corresponding to data chunk 213, would fail, as data chunk 223 contains errors. Host 102 may then instruct a memory controller (e.g., memory controller 120) to attempt to retrieve data chunk 233 on remote redundant storage medium 230. Memory controller 120 would be able to successfully retrieve redundant data chunk 233 corresponding to failed data chunk 213.

FIG. 3 shows, for example, a block diagram 300 of a data failure location determination using a bit map 320. Block diagram 300 includes storage medium 310 with data chunks 311-318. Data chunks 311, 312, 314, and 316 correspond to successful reads (i.e., these data chunks do not contain errors), and data chunks 313, 315, 317, and 318 correspond to failed reads (i.e., these data chunks contain errors and may be corrupt). Block diagram 300 also includes bitmap 320, with bits 321-328 corresponding to data chunks 311-318, respectively. Memory controller 106 updates bitmap 320 concurrently while attempting to retrieve the requested data chunks. In some instances, a single bit may be assigned to represent a single data chunk. As an exemplary embodiment, because there are eight data chunks 311-318 in storage medium 310, eight bits are assigned to be the bitmap for storage medium 310, with bit 321 representing data chunk 311, and bits 322-328 representing data chunks 312-318, respectively. The value of each bit (e.g., either a 1 or 0) corresponds to whether each the read for each data chunk was a success or a failure.

For example, memory controller 106 may return an eight-bit bitmap (e.g., "11010100") in the status information to host 102 corresponding to memory controller 106 attempting to retrieve the requested data from storage medium 310. Each "1" in the bitmap may represent a successfully read data chunk and each "0" in the bitmap may represent a failed data chunk. Bitmaps are conveniently employed as an error location-determining method. However, bitmaps may limit the read command size, as the amount of storage needed for a bitmap increases linearly as the size of data requested in the read command increases. Host 102 may determine the memory addresses corresponding to the failed data chunks by matching the bitmap to the data chunk memory location addresses.

As shown in FIG. 3, which illustrates one embodiment, a single bit represents a single data chunk. It is also within the scope of the disclosure that a single bit may represent multiple data chunks. This approach saves storage space by requiring fewer bits per error bitmap for a given number of data chunks, but sacrifices efficiency, as the exact data chunk that failed is harder to identify.

FIG. 4 shows a block diagram which depicts one embodiment of a data failure location determination using compression of the error bitmap by Run-Length encoding. Block diagram 400 includes storage medium 410 with data chunks 411-418. Data chunks 411, 412, 414, and 416 correspond to successful reads (i.e., these data chunks do not contain errors), and data chunks 413, 415, 417, and 418 correspond to failed reads (i.e., these data chunks contain errors and may be corrupt). Block diagram 400 also includes Run-Length 420 and Run-Length result 430. The Run-Length encoding stores runs of data (i.e., sequences in which the same data value occurs in many consecutive data elements) as a single data value and count (e.g., an error burst). Run-Length 420 includes outcomes 421-428, which correspond to the pass/fail status of data chunks 411-418, respectively. The outcomes 421-428 are converted into Run-Length result 430. Run-Length result 430 includes statuses 431, 433, 435, and 437, and lengths 432, 434, 436, and 438.

FIG. 4 is an exemplary embodiment where the Run-Length encoding can support four length pairs (e.g., 431 and 432, 433 and 434, 435 and 436, and 437 and 438). If, as demonstrated in FIG. 4, the number of error bursts exceed the number of length pairs, then the last length entry (e.g., length 438) returns a zero. For example, as storage medium 410 has six length pairs (e.g., a full Run-Length result of: [pass, 2; fail, 1; pass, 1; fail, 1; pass, 1; fail, 2]), and the Run-Length encoding only supports four length pairs, then memory controller 106 would transmit Run-Length result 430 in the status information as [pass, 2; fail, 1; pass, 1; fail, 0] to host 102 via host interface 105. Host 102 can determine, from the last length entry equaling "0," that there may be more failed data chunks after the fifth data chunk (e.g., data chunk 415). Host 102 can issue a read command to memory controller 106 to read the data chunks after data chunk 415 to determine the position of any remaining passed and failed data chunks.

For example, when host 102 receives Run Length result 430 from host interface 105 and Run-Length result 430 has the last length entry set to zero, then host 102 determines that there may be more passed and failed data chunks. In response to determining that there may be more passed and failed data chunks, host 102 transmits a read command to memory controller 106 via host interface 105 to read the remaining data chunks starting at the location of the data chunk that triggered the last length entry to be set to zero. Host 102 determines said location based on the summation of the entries in lengths 432, 434, 436, and 438 (e.g., 2+1+1+0=4).

Therefore, the exemplary embodiment in FIG. 4 has a Run-Length result 430 corresponding to the results from four data chunks (e.g., data chunks 411-414) before the number of error bursts exceeded the number of supported length pairs. Host 102 would then transmit a read command to memory controller 106 via host interface 105 to read the remaining data chunks starting at the location of the next data chunk, for example the fifth data chunk (e.g., data chunk 415) in exemplary FIG. 4. In response to receiving the command from host interface 105, memory controller 106 returns a Run-Length result 430 corresponding to the results from data chunks 415-418. In the exemplary embodiment in FIG. 4, the Run-Length result 430 corresponding to data chunks 415-418 would be: [fail, 1; pass, 1; fail, 2]. From this result, host 102 determines that all failed data chunks have been identified, as the last length entry in Run-Length result 430 is not a zero (e.g., the last length entry is a "2"). In the event that the last entry in Run-Length result 430 is a zero, host 102 repeats the above method until the last entry in Run-Length result 430 is a non-zero.

Run-Length encoding is more efficient than a bitmap, as it requires less storage, but it is most efficient when there are a scarce amount of errors in the data chunks. The number of Run Length pairs maybe defined on a per system basis, which may depend, for example, on the number of status bits available for storing the error map or its Run-Length encoded version.

Figure 5:
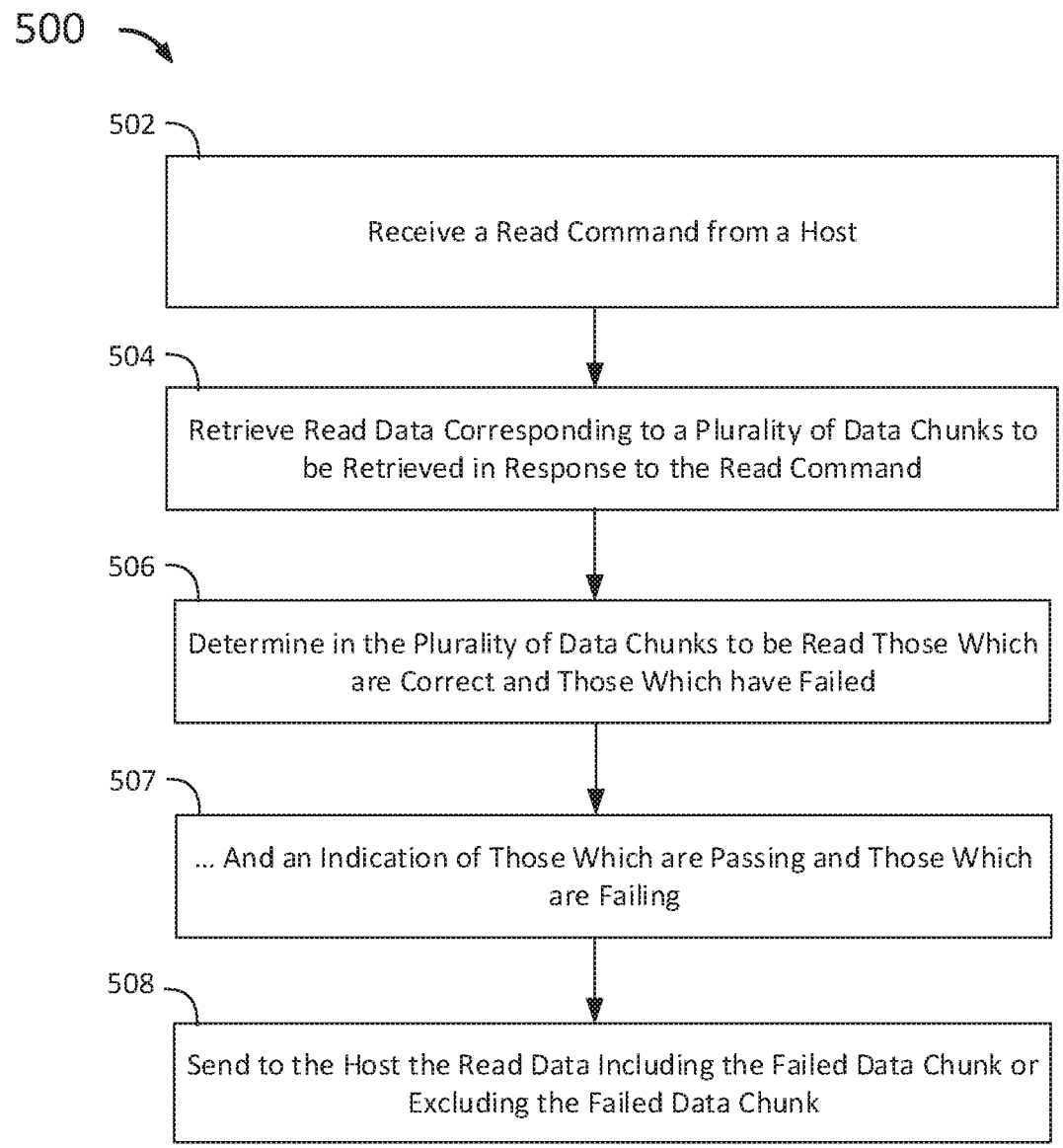
FIG. 5 shows a flow chart of a method for managing errors in a plurality of solid state drives.

In one embodiment, FIG. 5 shows a flow chart 500 of a method for managing errors in a plurality of solid state drives. At step 502, the memory controller receives a read command from the host. The read command may constitute a single address range or multiple address range describing data locations in the storage media which are to be read. At step 504, the memory controller retrieves read data corresponding to a plurality of data chunks to be retrieved in response to the read command. The memory controller retrieves the data based on the memory address locations included in the read command.

At step 506, the memory controller determines those data chunks of the plurality of data chunks that is unable to be read due to errors and builds the error map. At step 507, the host is informed of the location of the one or more failed data chunks using a location-error map, such as the bitmap or Run-Length encoded bitmap described in detail in FIGS. 3-4.

At step 508, the memory controller sends the host the read data including the failed data chunk or excluding the failed data chunk. The memory controller sends the data to the host by writing the data into a buffer specified by the host. For example, the memory controller may return the requested read data with 'holes' where the one or more data chunks were unable to be read due to errors. As another example, the memory controller may return the requested read data by writing the readable data chunks in the locations specified by the host, and by writing placeholder data (i.e., dummy data) in the locations in the buffer meant for the data from the failed data chunks. In yet another example, the memory controller may return the requested read data by writing the readable data chunks in the locations specified by the host and by writing the raw errored data in the locations in the buffer meant for the data from the failed data chunks.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

What is claimed is:

1. A method for managing errors in a solid state drive (SSD), the method comprising:
    receiving, at a memory controller coupled to at least one storage medium in storage media in the SSD, a read command from a host interface;
    retrieving, from the storage medium, read data corresponding to a plurality of data chunks to be retrieved in response to the read command;
    identifying from the retrieved read data a first portion of the plurality of data chunks that does not contain an error and a second portion of the plurality of data chunks that does contain an error; and
    sending to the host interface the first portion, the second portion, and status information for the second portion.

2. The method of claim 1, wherein sending the second portion comprises sending data that is selected from the group consisting of null data, dummy data, and raw error data.

3. The method of claim 1 wherein the status information for the second portion identifies at least one failed data chunk in the second portion as containing an error.

4. The method of claim 1, wherein the step of sending further comprises sending to the host interface status information for the first portion.

5. The method of claim 4, wherein the status information for the first portion identifies at least one data chunk in the first portion as free from errors.

6. The method of claim 1, further comprising the step of:
    retrieving the second portion from a second storage medium different from the at least one storage medium, wherein the second storage medium is redundant with respect to the at least one storage medium;
    identifying from the second portion a third portion of the plurality of data chunks that does not contain an error and a fourth portion of the plurality of data chunks that does contain an error; and sending to the host interface the third portion and status information for the fourth portion.

7. The method of claim 6, wherein the second storage medium is a local storage medium disposed within the SSD.

8. The method of claim 6, wherein the second storage medium is a remote storage medium relative to the SSD.

9. The method of claim 6, further comprising sending to the host interface the fourth portion, wherein sending the fourth portion comprises sending data that is selected from the group consisting of null data, dummy data, and raw error data.

10. The method of claim 1, further comprising the step of determining from the status information for the second portion that execution of the read command failed.

11. The method of claim 1, further comprising determining, using a bitmap, a location in the at least one storage medium of the second portion.

12. The method of claim 11, wherein the bitmap is compressed using Run-Length encoding.

13. A system for managing errors in a plurality of storage media, the system comprising:
   a host interface;
   a memory controller configured to be communicatively coupled to a host via the host interface; and
   at least one storage medium communicatively coupled to the memory controller;
   the memory controller configured to:
      receive a read command from the host interface;
      retrieve, from the at least one storage medium, read data corresponding to a plurality of data chunks to be retrieved in response to the read command;
      determine that at least one data chunk of the plurality of data chunks is unable to be read and contains errors, the at least one data chunk corresponding to a failed data chunk; and
      send to the host interface the failed data chunk and status information indicative of a failed retrieval of the read data corresponding to the plurality of the data chunks.

14. The system of claim 13, wherein the storage medium is a first storage medium, and the host interface is configured to:
   retrieve only data corresponding to the failed data chunk from a second storage medium.

15. The system of claim 13, wherein the read data includes the failed data chunk, the failed data chunk comprising placeholder data.

16. The system of claim 15, wherein the host is configured to:
   determine from the status that the read command failed; and
   determine, from the status, the at least one data chunk contains errors.

17. The system of claim 13, wherein the read data includes the failed data chunk, the failed data chunk comprising raw error data.

18. The system of claim 17, wherein the status comprises a bitmap conveying the location of at least one location of a failed data chunk within all the read data.

19. The system of claim 13, wherein the host interface is further configured to determine the location of at least one data chunk corresponding to the failed data using a bitmap.

20. The system of claim 19, wherein the bitmap is encoded using Run-Length encoding.

* * * * *